United States Patent [19]
Wojewoda et al.

[11] Patent Number: 5,731,742
[45] Date of Patent: Mar. 24, 1998

[54] EXTERNAL COMPONENT PROGRAMMING FOR CRYSTAL OSCILLATOR TEMPERATURE COMPENSATION

[75] Inventors: Carl Wojewoda, Lake Zurich; Timothy Collins, Downers Grove; Michael Bushman, Hanover Park, all of Ill.

[73] Assignee: Motorola Inc., Schaumburg, Ill.

[21] Appl. No.: 767,745

[22] Filed: Dec. 17, 1996

[51] Int. Cl.$^6$ .............................. H03B 5/32; H03B 5/04; H03L 1/02
[52] U.S. Cl. .............................. 331/44; 331/158; 331/176; 331/177 V; 455/318; 455/264
[58] Field of Search .............................. 331/44, 66, 116 R, 331/116 FE, 158, 176, 177 V; 310/315, 318; 455/264; 1/318

[56] References Cited

U.S. PATENT DOCUMENTS

| | | |
|---|---|---|
| 4,254,382 | 3/1981 | Keller et al. ..................... 331/116 R |
| 5,041,799 | 8/1991 | Pirez ..................................... 331/44 |
| 5,392,005 | 2/1995 | Bortolini et al. ..................... 331/44 |

*Primary Examiner*—David Mis
*Attorney, Agent, or Firm*—Brian M. Mancini

[57] ABSTRACT

A temperature compensation circuit (10) for a crystal oscillator programmed by a single component (12), such as a resistor. The component (12) provides a voltage to an A/D converter (26). The digital signals (28) from the A/D converter (26) are divided and directed to separate signal generators (44,46,48,50,56) which control different aspects of the temperature compensation circuit (10). These aspects include a hot, cold, linear, balance and warp adjustment. The temperature compensation circuit (10) drives a varactor (18) which reactively loads a crystal oscillator (14) to compensate frequency over temperature. By using a single component (12) to program the circuit (10), an EEPROM is no longer needed which saves IC space and reduces IC processing steps, and the use of multiple external components to perform a compensation is avoided which further saves physical space.

22 Claims, 9 Drawing Sheets

-PRIOR ART-

-PRIOR ART-

122

/ 1

EXTERNAL COMPONENT PROGRAMMING FOR CRYSTAL OSCILLATOR TEMPERATURE COMPENSATION

FIELD OF THE INVENTION

The invention relates generally to the field of temperature compensating circuits for crystal oscillators, and in particular, to external component programming for crystal oscillator temperature compensation.

BACKGROUND OF THE INVENTION

Oscillators that have a frequency determining crystal are commonly used to provide a stable output frequency. However, the crystals used in such oscillators are temperature sensitive and therefore temperature compensating circuits are normally required to maintain a stable oscillator frequency. One technique used for temperature compensating the crystal is to generate a temperature varying voltage and apply it across a voltage variable reactance (e.g. varactor diode) to control the resonant frequency of the crystal oscillator. Analog and digital techniques have been used to accomplish this result.

A commonly used digital technique is to measure the temperature variation of a crystal oscillator over discrete predetermined temperature points. At each temperature point a D/A converter is programmed to produce a compensating voltage across a voltage variable capacitor which drives the crystal oscillator to a desired frequency. The information used to program the D/A converter at each temperature point is stored in a memory such as a PROM, EPROM, or EEPROM.

A commonly used analog technique is to provide discrete components in a driving circuit to provide a predetermined analog voltage function over temperature. This voltage is applied across a voltage variable capacitor to drive a crystal oscillator to a desired frequency. However, because typical crystals do not have a linear temperature response, numerous discrete components and circuits are needed to compensate each segment of a crystal's temperature response. For example, the commonly used AT-cut quartz crystal has a cubic temperature response having a non-linear response at hot and cold temperatures and a linear response at moderate temperatures. Generally, this requires at least three voltage driving segments to compensate, two individual non-linear driving segments for the hot and cold temperatures and a linear driving segment for the moderate temperatures. Further, more accurate analog networks require more than three voltage driving segments to compensate for the inflection temperature and to drive the oscillator to a nominal frequency.

The digital compensation circuits have the disadvantage of requiring a relatively large programmable memory which increases the cost of an integrated circuit. Further, there have been instances where the memory is inadvertently erased in the field which destroys the usefulness of the oscillator. Also, using EEPROM or any other type of PROM technology can increase the number of processing steps which increases cost.

The analog compensation circuits have the disadvantage of requiring the experimental determination of each discrete element for each driving circuit which is time and labor intensive. Further, analog compensation requires tightly specified crystal performance since the flexibility of compensating each crystal is limited.

The need exists for a new crystal temperature compensation circuit which; does not require the use of digital programmable memory, does not require the use of multiple discrete components for temperature compensation, can cover a wide range of crystal temperature performance deviations, and is readily implementable.

DETAILED DESCRIPTION OF THE PREFERRED EMBODIMENT

Figure 1:
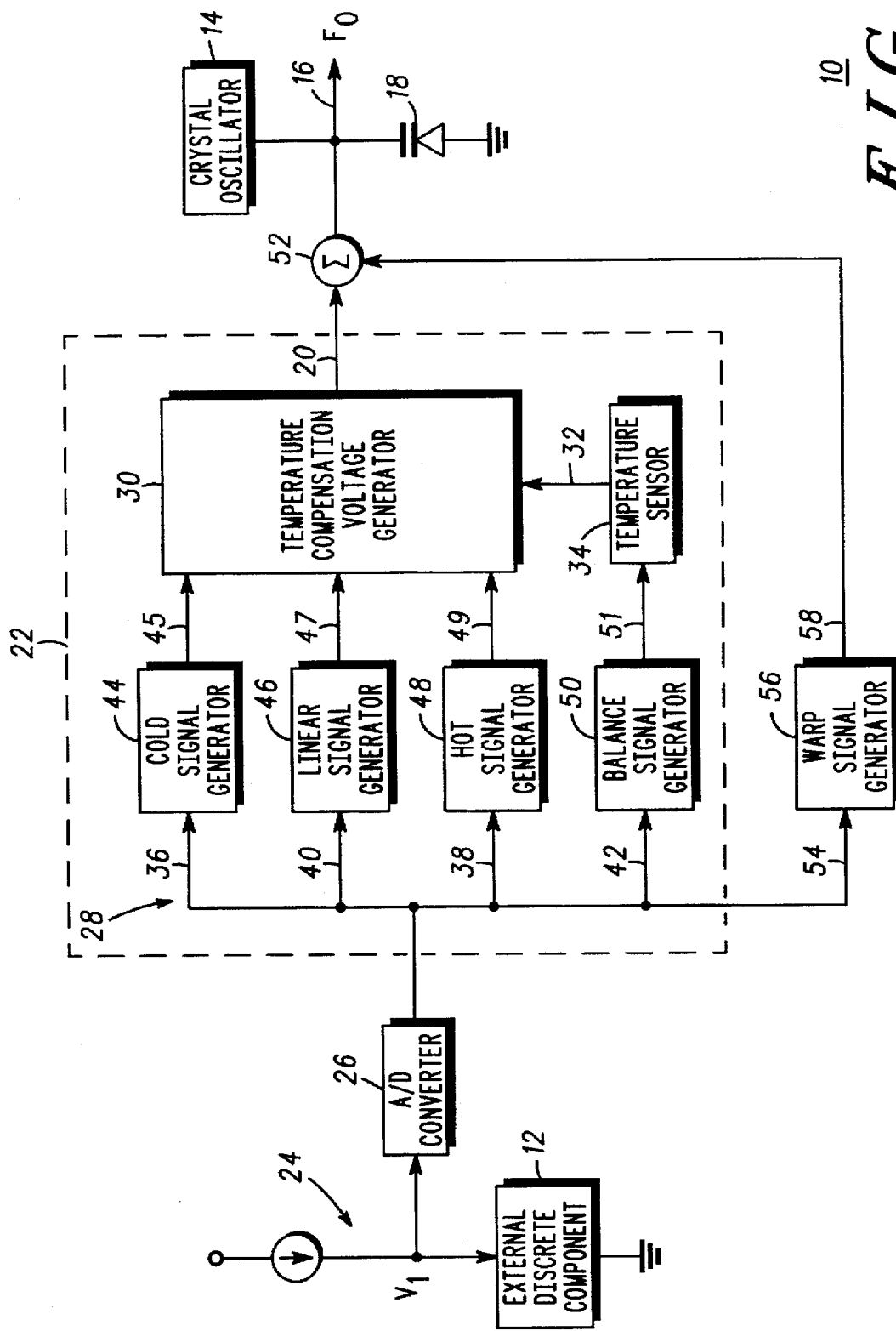
FIG. 1 is a block diagram of a temperature compensation circuit programmed by an external component, in accordance with the present invention.

FIG. 1 shows a block diagram of a crystal oscillator temperature compensation circuit 10 programmed by an external discrete component 12. A crystal oscillator 14 with a piezoelectric element provides the oscillator output signal 16. In one embodiment, the piezoelectric element is an AT-cut crystal having a frequency output which is dependent on the load reactance, its crystallographic angle, and the ambient temperature. A voltage variable reactance, such as a varactor 18, is coupled to the crystal oscillator 14, and is controlled to vary the load reactance, and therefore the crystal oscillator frequency, over a predetermined temperature range. The varactor 18 varies the frequency of the crystal oscillator 14 by reactively loading the oscillator in response to a compensation signal 20 generated by a compensation circuit 22 which is coupled to the varactor 18. For a given crystal, the temperature compensation circuit 22 must be characterized to generate a compensation signal 20 which minimizes frequency shifts of the output signal 16 over temperature.

The compensation circuit 22 is characterized by a single predetermined voltage, $V_1$, generated by an external discrete component 12, such as a resistor or thermistor, in a voltage divider or current driver stage 24. The single voltage, $V_1$, is applied to an A/D converter 26 to generate a predetermined set of digital signals 28 which are subsequently applied to the compensation circuit 22. The compensation circuit 22 includes at least one, and preferably a set of, signal generators 44,46,48,50 which control a temperature compensation voltage generator 30. The temperature compensation voltage generator 30 is concurrently fed by a temperature signal 32 from a temperature sensor 34.

The set of digital signals 28 are uniquely determined for each crystal in a separate, off-line crystal temperature characterization operation. The external component 12 acts as a simple physical memory storage element for these signals 28. This has the advantage of eliminating the need for a non-volatile memory, such as an EEPROM. In addition, a component 12 such as a resistor has a much lower cost than a non-volatile memory. The compensation circuit 22 and the varactor 18 are integrated utilizing well known integrated circuit processes, such as bipolar, BiMOS, or CMOS technology. By not requiring a non-volatile memory, the integrated circuit can be made much smaller and with less processing steps which reduces costs. Alternatively, the varactor 18 may be made physically much larger for a given IC size, giving the compensation circuit 22 a much greater range to adjust crystal frequency which reduces crystal cost.

In operation, the predetermined voltage, $V_1$, from the external component 12 is applied to the A/D converter 26 which generates a set of digital signals 28 correlating to the voltage, $V_1$. The set of signals 28 include a cold temperature compensating signal set 36, a hot temperature compensating signal set 38, a linear temperature compensating signal set 40, and a balance signal set 42 for adjusting an inflection temperature of the oscillator. Each of these signals is applied to a corresponding cold, hot, linear, and balance signal generator 44,48,46,50 which provide respective cold, hot, linear, and balance analog signals 45,49,47,51 to the temperature compensation voltage generator 30 necessary for the operation of the compensation circuit 22. The levels of the signals 45,49,47,51 produced by the signal generators 44,48,46,50 is commensurate with the input bit pattern of each of the cold, hot, linear, and balance temperature compensation signal sets 36,38,40,42. The temperature compensation signal 20 from the generator 30 is subsequently applied, through a summer 52, to the varactor 18 coupled to the crystal oscillator 14. As the varactor 18 changes reactance, in response to the temperature compensation signal 20 changing over temperature, the crystal oscillator 14 is driven to provide a substantially constant frequency over the desired temperature range.

In another embodiment, the A/D converter 26 provides a fifth (warp) digital signal set 54 for frequency adjust or trim. The warp signal set 54 is used to adjust the nominal frequency of the crystal, only. The warp signal does not vary the frequency over temperature, but provides a constant frequency offset across the entire temperature range of interest. The warp signal set 54 is applied to a warp signal generator 56 to provide an analog warp signal 58 necessary for the uniform translation of the temperature compensation signal 20. The analog signal 58 is subsequently applied to the varactor 18 through the summer 52 to change the varactor reactance by a constant amount over temperature. The warp signal advantageously provides a way to adjust the output signal 16 to a nominal frequency.

Figure 2:
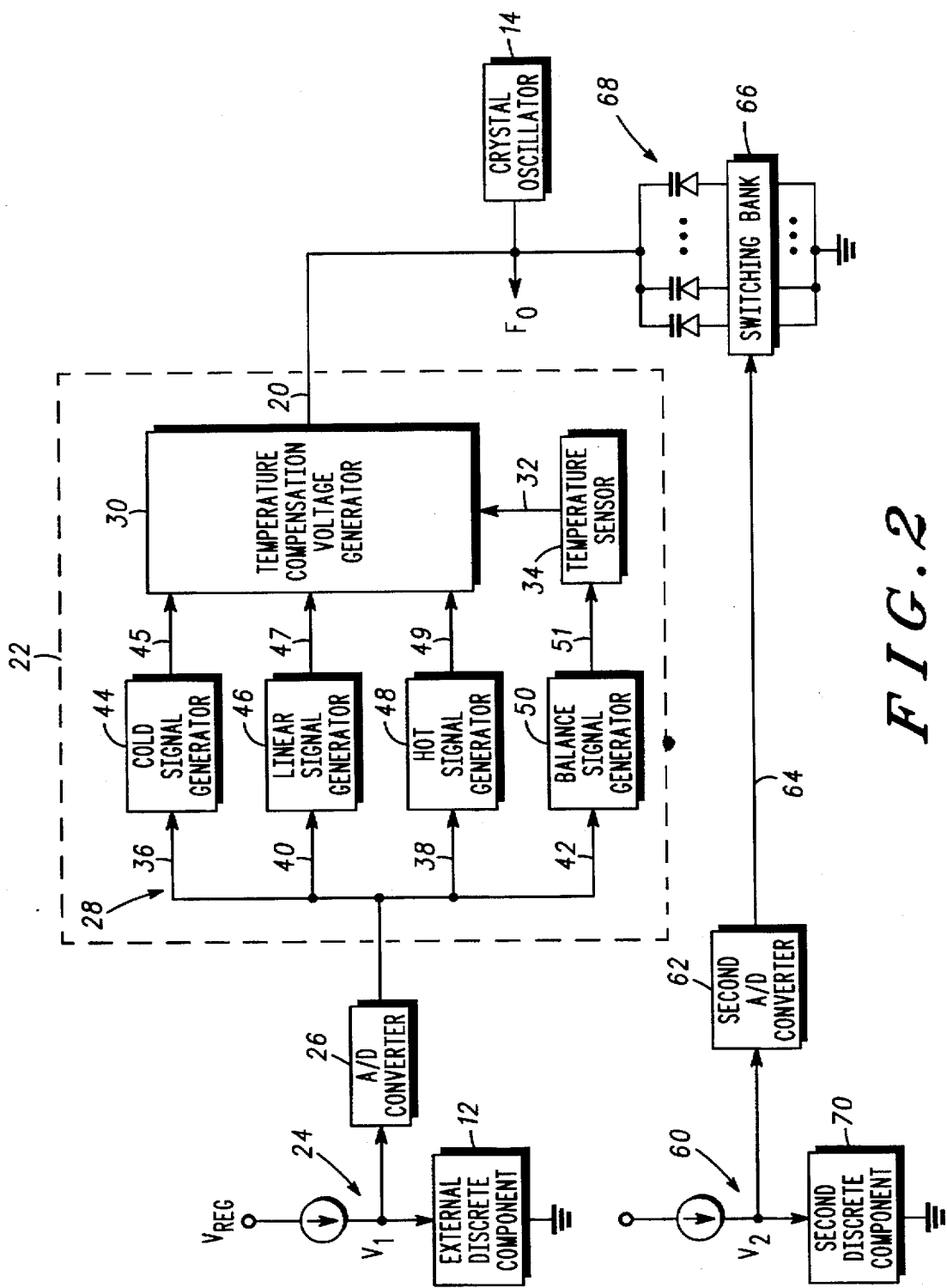
FIG. 2 is a block diagram of a temperature compensation circuit programmed by at least one external component, in accordance with the present invention.

FIG. 2 shows a block diagram of a crystal oscillator temperature compensation circuit programmed by at least one external programming component. This embodiment uses substantially the same basic circuitry of FIG. 1, but it isolates the warp function. In this embodiment, a warp voltage, $V_2$, is generated by a second external discrete component 70, such as a resistor, in a second voltage divider or current driver stage 60. The warp voltage, $V_2$, is applied to an second A/D converter 62 to generate a predetermined digital switching signal 64 which is subsequently applied to a warp switching bank 66.

Alternatively, the functionality of the second A/D converter 62 may be incorporated into the the first A/D converter 26 if a multiplex switching scheme is used between the compensation circuit 22 and the warp switching bank 66. This alternative allows the invention to function with only one A/D converter 26, but at the addition of a multiplex switch (not shown).

The warp switching bank 66 couples a plurality of geometrically-valued voltage variable reactances, such as varactors 68, into the circuit according to the predetermined warp voltage, $V_2$. By switching in appropriate parallel increments of capacitance the warp switching bank 66 can select the correct capacitance needed to drive the oscillator 14 to a nominal frequency while the temperature compensation circuit 22 simultaneously adjusts the varactors 68 to vary load capacitance over temperature in response to the temperature compensation signal 20 programmed by $V_1$ which is generated by the external component 12.

The advantage of this embodiment is that the nominal frequency of the oscillator may be adjusted separately in the field without disturbing the preset temperature compensation. Also, the use of a separate warp circuit allows the retention of the proper temperature compensation signal without the possibility of accidental modification or erasure in the field. Further, the summer and warp signal generator used in the embodiment of FIG. 1 is no longer needed. In addition, the use of multiple varactors allows a much greater frequency adjustment range.

Figure 3:
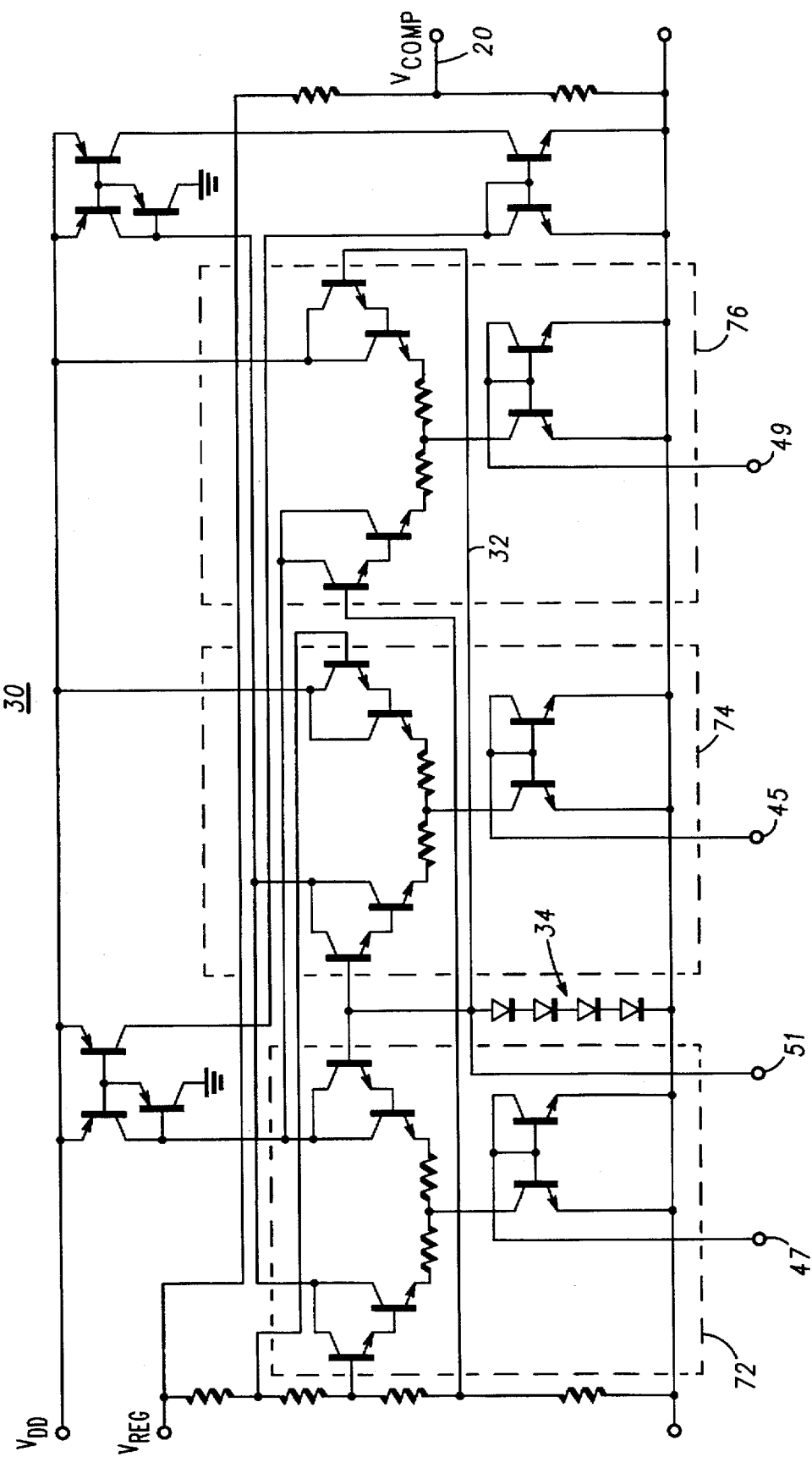
FIGS. 3 and 4 are schematic diagrams of a temperature compensation voltage generator and temperature sensor, in accordance with the present invention.
Figure 4:
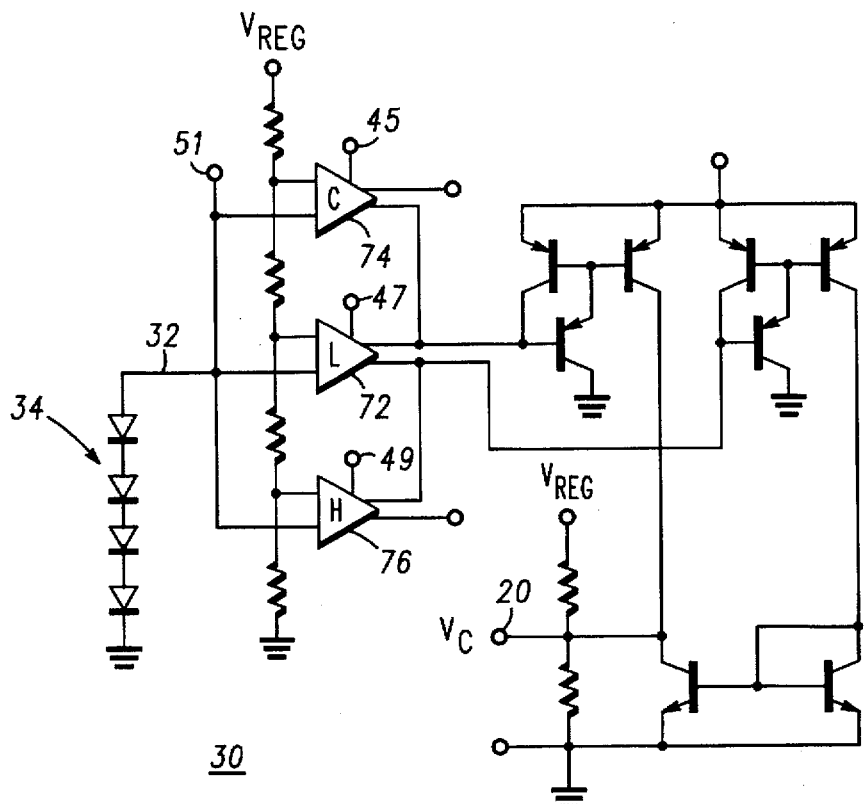

Referring to FIGS. 3 and 4, the schematic diagram of the temperature compensation voltage generator 30 and temperature sensor 34 is shown. The temperature sensor 34 comprises a well known diode string configuration which generates a temperature signal 32 in response to the ambient temperature. The temperature signal 32 is simultaneously applied to programmable differential amplifiers wherein a current through a differential pair of each amplifier is controlled by the signal levels of the hot, cold, and linear temperature compensating analog signals 49,45 47, respectively. The voltage generator 30 comprises: a linear region current generating differential amplifier 72, a cold region current generating differential amplifier 74, and a hot region current generating differential amplifier 76. The temperature signal 32 is coupled to a first input of each differential amplifier 72,74,76 to establish a temperature dependent input voltage level. The other input of each differential amplifier 72,74,76 is coupled to a fixed voltage level. Therefore, the inputs to each differential amplifier 72,74,76 provide a temperature dependent differential voltage. The outputs of the differential amplifiers 72,74,76 are summed to produce a temperature compensation signal 20 from the voltage generator 30. The balance signal 51 is applied to translate an inflection temperature of the temperature compensation signal 20. The operation of the differential amplifiers and for providing the balance, linear, hot and cold signals in response to the temperature signal is fully described in U.S. Pat. No. 5,041,799 issued to Pirez and U.S. Pat. No. 4,254,382 issued to Keller et al. which are hereby incorporated by reference.

Figure 5:
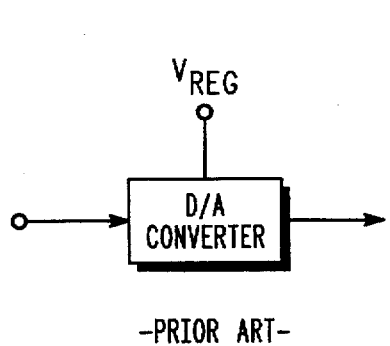
FIG. 5 is a diagram of a prior art D/A converter used as a signal generator, in accordance with the present invention.

The signal generators 44,46,48,50,56 of FIGS. 1 and 2 may be of several configurations. In FIG. 5, an embodiment using a prior art D/A converter configuration is shown. This configuration has the disadvantage of being expensive to implement. Further D/A converters are commonly used to continuously change output in response to a varying input voltage. The present invention only requires a single constant output from each signal generators 44,46,48,50,56. Therefore, the capabilities of D/A converters would be underutilized.

Figure 6:
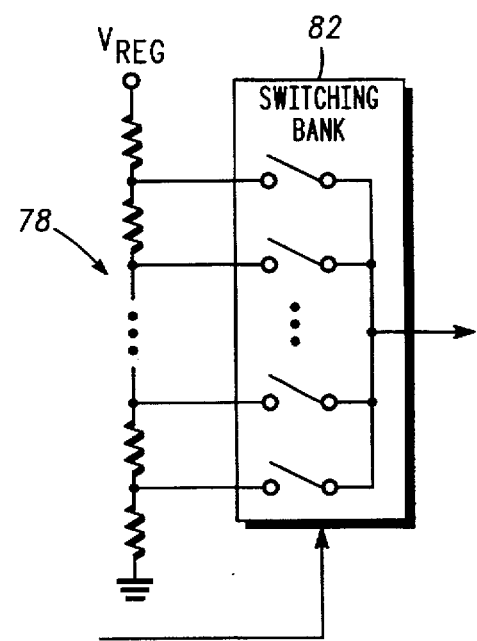
FIG. 6 is a diagram of one embodiment of a signal generator, in accordance with the present invention.

In another prior art embodiment shown in FIG. 6, the signal generators 44,46,48,50,56 includes a resistor string 78 switchably connected to a switching bank 82. A signal set (such as 36,38,40,42,54 in FIG. 1) input to a signal generator (such as 44,46,48,50,56 in FIG. 1) couple to the switching bank 82 which taps the resistor string 78 at a predetermined resistance so as to increase or decrease voltage to obtain a desired voltage output which is applied to the temperature compensation voltage generator 30. This configuration has the disadvantage of larger current drain.

Current and voltage signals are used differently by the voltage generator 30. Changing the currents from the cold, hot and linear signals 45, 47, 49 to the voltage generator 30 effectively changes the slope of the temperature compensation function of the circuit. Changing the voltage to the voltage generator 30 effectively changes the offset of the temperature compensation function of the circuit. The number of bits needed for each individual signal set 36,38,40, 42,54 to provide any particular slope/offset may be as little as two bits, depending on the crystal angle ranges and output stability to be accommodated.

Figure 7:
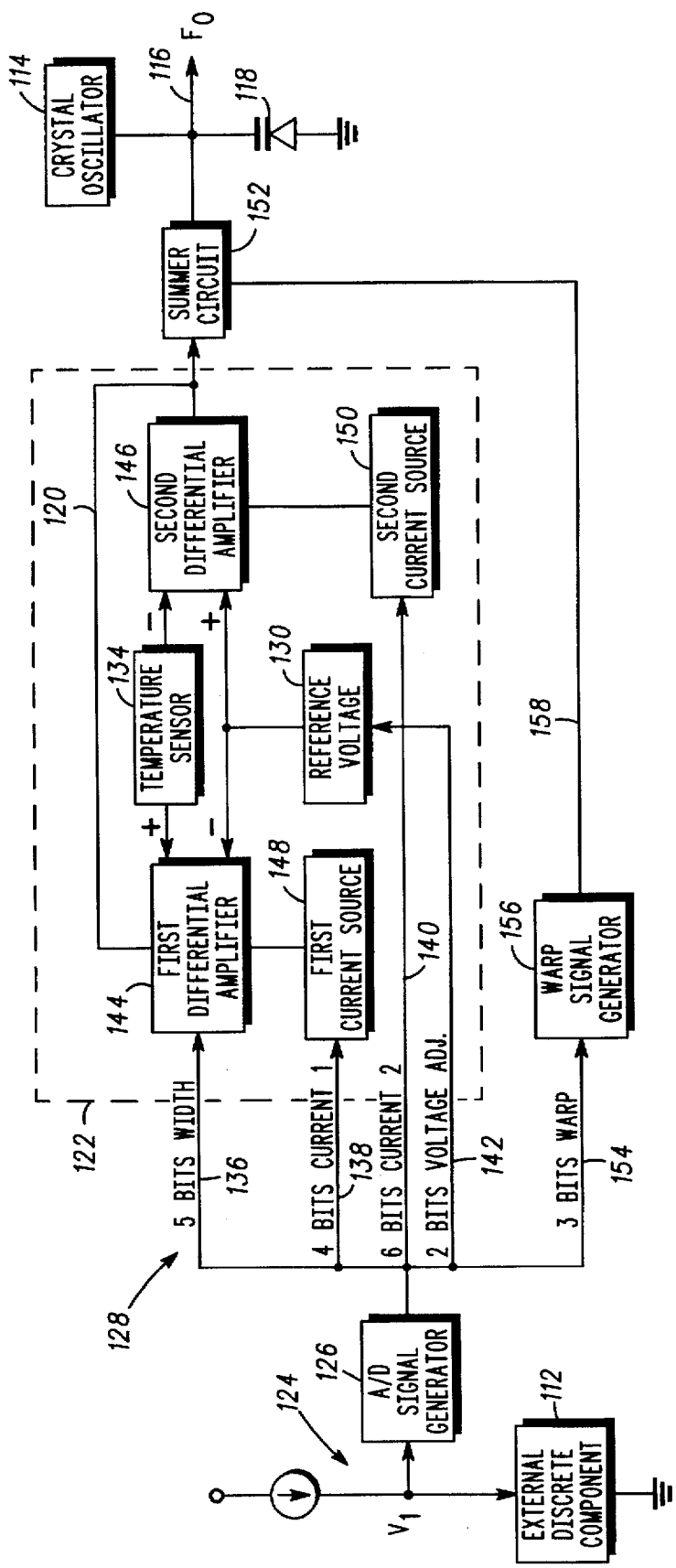
FIG. 7 is a block diagram of a preferred embodiment of a temperature compensation circuit programmed by an external component, in accordance with the present invention.

FIG. 7 shows a block diagram of a preferred embodiment of a temperature compensation circuit 100 programmed by an external discrete component 112. A crystal oscillator 114 with an AT-cut quartz crystal provides the oscillator output signal 116 which is dependent on load reactance, the crystallographic angle of the crystal, and the ambient temperature. A voltage variable reactance, such as a varactor 118, is coupled to the crystal oscillator 114, and is controlled to vary the load reactance, and therefore the crystal oscillator frequency, over a predetermined temperature range. The varactor 118 varies the frequency of the crystal oscillator 114 by reactively loading the oscillator in response to a compensation signal 120 generated by a compensation circuit 122 which is coupled to the varactor 118. For a given crystal, the compensation circuit 122 must be characterized to generate a compensation signal 120 which minimizes frequency shifts of the output signal 116 over temperature.

The compensation circuit 122 is characterized by a single predetermined voltage, $V_1$, generated by an external discrete component 112, preferably a resistor, in a voltage divider or current driver stage 124. The single voltage, $V_1$, is applied to an A-to-D signal generator 126 to generate a predetermined set of digital signals 128 which are subsequently applied to the compensation circuit 122 and the warp signal generator 156. It should be recognized that other external component implementations are possible depending on the structure of the A-to-D signal generator 126. The compensation circuit 122 includes at least a first and a second differential amplifier 144,146 coupled to respective first and second current sources 148,150. The differential amplifiers 144,146 are differentially coupled to a signal from a temperature sensor 134 and a signal from a reference voltage 130.

The set of digital signals 128 are uniquely determined for each crystal in a separate, off-line crystal temperature characterization operation. The set of signals 128 include a five bit width signal set 136 applied to the first differential amplifier 144, a four bit tail current (current 1) signal set 138 applied to the first current source 148, a six bit tail current (current 2) signal set 140 applied to the second current source 150, a two bit voltage adjust signal set 142 applied to the reference voltage 130, and a three bit warp signal set 154 applied to the warp signal generator 156.

Preferably, the first differential amplifier has an effectively adjustable electrical width (explained below) which is controlled by the width signal set 136. The second differential amplifier 146 is of a standard design which is known in the art. A higher performance compensation circuit 122 could be achieved with two adjustable width differential amplifiers, or further by cascading additional differential amplifier stages. However, this unnecessarily adds to the cost and complexity of the compensation circuit. A lower performance compensation circuit could be achieved with only one differential amplifier, but this is not practical in that the single differential amplifier circuit could only be used over a smaller temperature range or with very well sorted crystals.

As shown in FIGS. 7 and 8, the respective differential amplifiers 144,146 include corresponding current sources 148,150. Preferably, the current sources 148,150 are independently programmable. The programmable current sources 148,150 of the present invention are controlled by the current 1 and current 2 digital signal sets 138,140. Programmable current sources are known in the art and can be implemented in a number of ways without significant difference in their performance with a differential amplifier. The programmable current sources 148,150 of the present invention are used to select the transconductance of the differential amplifiers 144,146. In this way, the proper compensation voltage versus temperature slope can be set.

Figure 8A:
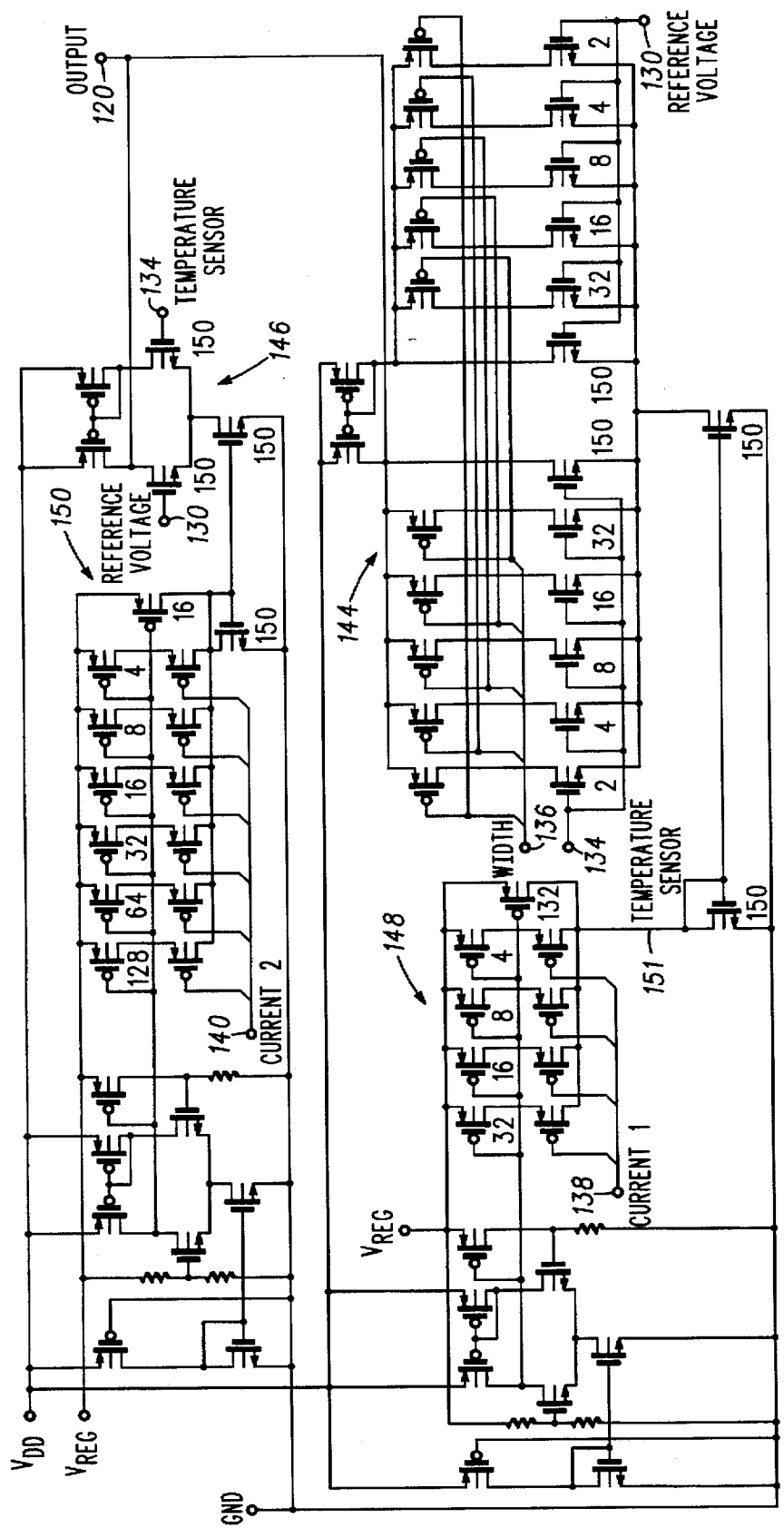
FIG. 8A and 8B are each a schematic diagram of the compensation circuit of FIG. 7, in accordance with the present invention.
Figure 8B:
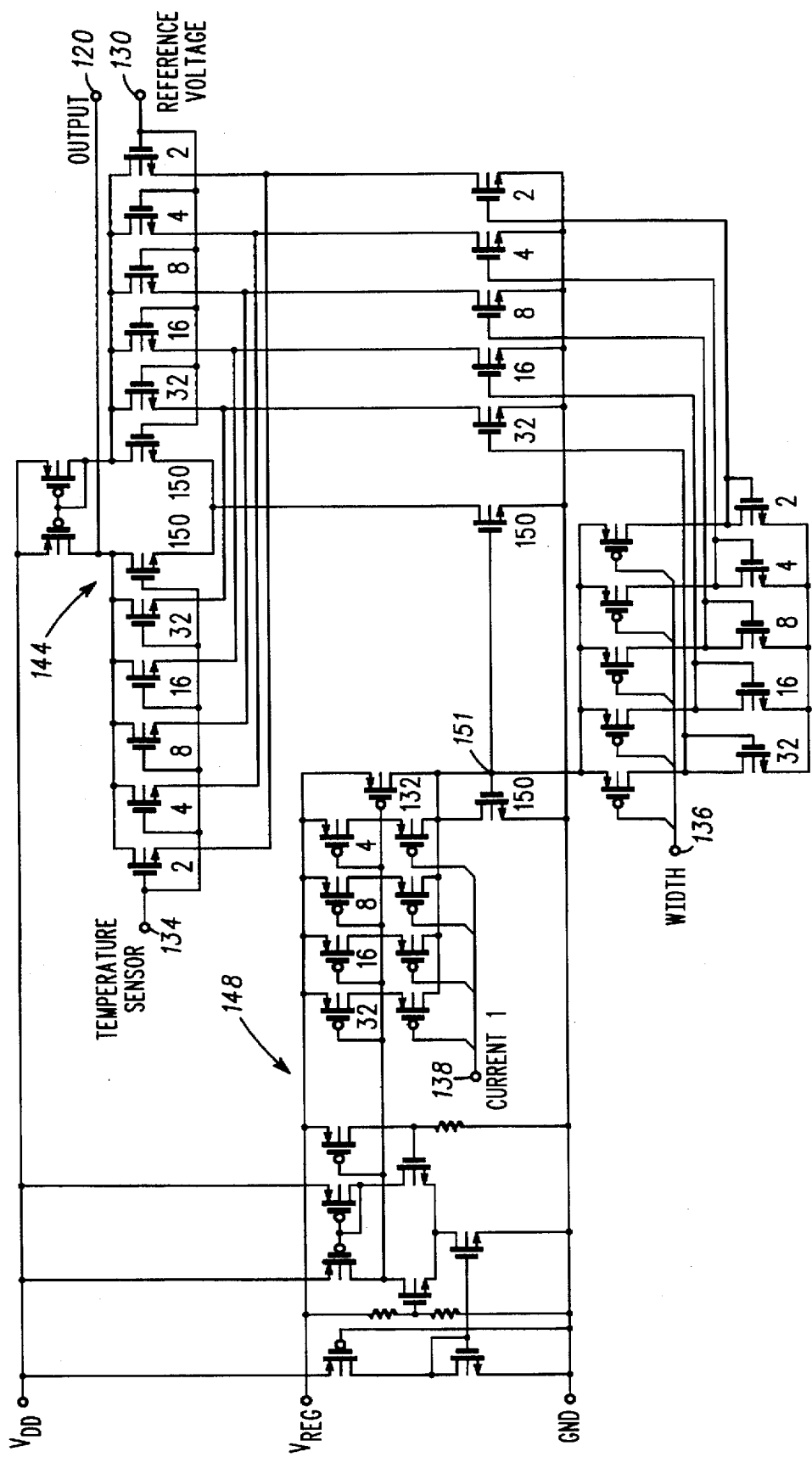
Figure 9:
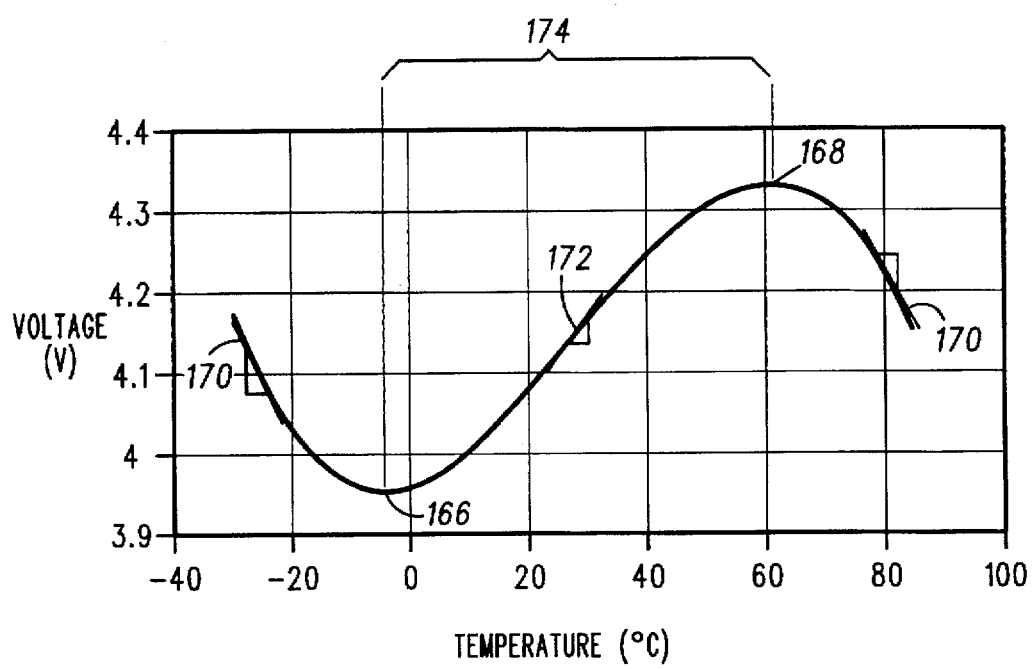
FIG. 9 is a plot of calculated compensation voltage versus temperature for the temperature compensation circuit of FIG. 8, in accordance with the present invention.

Consider the graph of FIG. 9, which shows an experimental compensation voltage plot needed to achieve better than 5 ppm temperature compensation of a crystal oscillator over temperature. The maximum and minimum points 166, 168 on the plot correspond to turning points on a Bechmann curve of an AT cut quartz crystal, which is known in the art. Outside of the turning points 166,168, an outside slope 170 is defined having a large value, which can be approximated as a constant. This slope 170 is determined by a transconductance of the transistors of the second differential amplifier 146 and second current source 150 and is constant over the desired range of temperatures (as related by the voltage output of the temperature sensor 134). In one embodiment the present invention, field-effect-transistors, FETs, are used throughout the differential amplifiers 144,146 and current sources 148,150 (as shown in FIG. 8). The slope 170 is determined by the process gain of the FETs of the second differential amplifier 146, the width-to-length ratio of the FET channels and the second programmable current source 150. The width of the FET channels are chosen so that the current is approximately linear over the given range of input voltages from the temperature sensor 134 and the reference voltage 130.

Between the turning points 166,168 an inside slope 172 is defined. The inside slope 172 is determined by a transconductance of the transistors of the first differential amplifier 144 and the first current source 148. The slope 172 is determined by the process gain of the FETs of the first differential amplifier 144, the width-to-length ratio of the FET channels and the first programmable current source 148. The first differential amplifier 144 has an additional degree of freedom in that the effective electrical width of the FETs can be changed by the parallel combination of selected FETs of differing channel widths. This allows expansion or contraction of a temperature distance 174 between the turning points 166,168. The reference voltage 130 (as shown in FIG. 7) is used to adjust an inflection temperature, or center, of the temperature distance 174. This is an important enhancement in the operation of the compensation circuit 122. While a 5 ppm frequency stability temperature compensation circuit may be achieved using constant width FETs for both differential amplifiers, the effectively adjustable width of the first differential amplifier 144 of the present invention provides for tighter frequency stability.

The transconductance, $g_m$, of a differential amplifier is given by $$g_m = \sqrt{\frac{2I_D k_p W}{L}}$$

where $I_D$ is the current of the current source, $k_p$ is the process gain of the FETs, W is the effective width of the FET channel, and L is the length of the FET channel. The saturation voltage of the input FETs, which marks the end of the linear region of operation, is given by $$V_{ds\ sat} = \sqrt{\frac{2I_D L}{k_p W}}$$

Therefore, if all other parameters are held constant, changing the current, $I_D$, will change both the transconductance, $g_m$, and the saturation voltage, $V_{ds\ sat}$. However, having the ability to change both the current, $I_D$, and the effective width, W, allows independent specification of the transconductance and saturation voltage, which corresponds to separate optimization of the temperature distance 174 between the turning points 166,168 and the inside slope 172 in the linear region of the temperature compensation.

The width signal set 136 determines which of the programmable FETs of the first differential amplifier 144 are biased to conduct. The channels of these FETs only need be dimensioned to assure that each individual FET operates in a linear or "triode" region when they are biased to conduct, and that they are insignificant leakage paths when they are biased not to conduct. The FETs are configured in pairs. Every FET pair that is selected to conduct is connected in parallel with other conducting FET pairs. This action is equivalent to increasing a channel width of a single larger device. Also, a given differential voltage will produce a larger output voltage as more FET pairs are switched on, just as a single larger device would if its channel width were increased. Moreover, switching more FET pairs to conduct will mean that the maximum differential current is found at a smaller differential voltage (just as a single larger device would behave) so that the effective saturation voltage, $V_{ds\ sat}$, can be changed.

FIG. 8A shows one embodiment of the compensation circuit 122. The FETs of the differential amplifiers 144,146 and current sources 148,150 are labeled with a number representing the channel width in μm. For purposes of calculation, the channel lengths of the FETs were all chosen to be 30 μm. The channel width of the FETs of the second differential amplifier 146 are fixed at 150 μm. The FETs of the first differential amplifier 144 are a parallel combination of FETs having respective channel widths of 150, 32, 16, 8, 4 and 2 μm. This gives a selectable effective channel width of from 150 μm to 212 μm in 2 μm increments. Analogously, the current sources 148,150 can be controlled with a sufficient resolution to provide a temperature compensate signal 120 sufficient to drive a crystal oscillator to maintain a frequency over temperature to within 2 ppm.

FIG. 8B shows a preferred embodiment of the compensation circuit 122. Note that just the first differential amplifier 144 and first current source 148 portions of the compensation circuit is shown, but the preferred implementation of at least two amplifiers is still recommended with the second differential amplifier 146 and the second current source 150 remaining as shown in FIG. 8A. An advantage of this embodiment is that it has a greater input voltage range for a given $V_{DD}$, or it could be made to operate with a lower $V_{DD}$ which is desirable in the marketplace.

In this embodiment, rather than switching the drains of the devices in the differential amplifiers, the tails currents of the parallel connected differential pairs are switched. In effect, rather than having a common source and switching the drains for all the parallel connected differential pairs of FIG. 8A, this embodiment has a common drain for the parallel connected differential pairs, each having their source switchably connected to current sources. The switched drain circuit of FIG. 8A requires additional operating voltage headroom because of the switches. Advanatgeously, the embodiment of FIG. 8B does not have this limitation, since a shared current source is used for any differential pair.

Another difference between the two embodiments of FIGS. 8A and 8B is the way the tail currents are established. In the switched drain approach of FIG. 8A, there is only one differential amplifier current source, and its current is determined only by the fixed current source and the setting of the current 1 signal set 138, and thereby establishes a current repeater bias voltage 151. The fraction of current in any given pair of devices, for example the devices shown with a channel width of 150 μm, depends on the width signal set 136. The width signal set 136 controls how many differential pairs are in parallel and therefore sharing current.

In the switched source approach of FIG. 8B, the total current into the collection of current repeaters is determined by the current 1 signal set 138, but the current in any one device, for example the device shown with a channel width of 150 μm, depends on the width signal set 136 since that now controls how many current repeaters are in parallel and therefore sharing current. The ability to change both slope and the onset of saturation is effectively the same since the ability to control the current through the parallel connected differential amplifiers is the same.

In operation, and referring to FIG. 7, the temperature compensation signals 120 from the differential amplifiers 144,146 are summed, along with a warp signal 158 from the warp signal generator 156, in a summer circuit 152. The summed signal is subsequently applied to the varactor 118 coupled to the crystal oscillator 114. As the varactor 118 changes reactance, in response to the temperature compensation signals 120 changing over temperature, the crystal oscillator 114 is driven to provide a substantially constant frequency over the entire temperature range.

In a preferred embodiment, the A-to-D signal generator 126 includes a 9 bit A/D converter (ADC) coupled to a combinational logic circuit. The specific implementation of the ADC is not important (i.e. counter, successive approximation, flash, etc.) but the resolution and range are important. An ADC must be designed or selected such that the ADC will give the required 9 bits of resolution for useful incremental values of external resistance with a given current source. The combinational logic circuit incorporates a "table lookup" function describing the digital information necessary to temperature compensate any crystal having a crystallographic angle within a 5 minute angle range to about 2 ppm frequency variation over temperature. Computer simulations have shown that a crystal specified to within a 0.5 minute angle can be compensated with only 9 input bits, the combinational logic circuit providing the needed translation for providing the required increased number of predetermined bits. There is no increase in information, so a simple combinational circuit can perform the 9-to-20 bit increase. It should be recognized that many other methods are known to perform this same function, such as EEPROM, wired-memory, and multiplexer based circuits. These could be used with no functional difference to the circuit.

Therefore, given a predetermined crystal angle, the A-to-D signal generator 126 can be programmed by the external component 112 to provide nine bits: four bits characterizing the crystal angle which are input to the combinational logic circuit, three bits are used to directly adjust the make tolerance (warp) the crystal frequency, and two bits are used to directly adjust the reference voltage. The four bits are translated by the combinational logic circuit to output fifteen bits: five predetermined bits describing the required width signal set 136, four predetermined bits describing the required current 1 signal set 138, and six predetermined bits describing the required current 2 signal set 140 to compensate the given crystal angle.

The warp signal 158 is used to adjust the nominal frequency of the crystal, only. It does not vary frequency over temperature. The warp signal 158 translates the temperature compensation function a uniform amount across the entire temperature range of interest. The warp signal set 154 is applied to a warp signal generator 156 to provide the analog warp signal 158 necessary for the uniform translation of the temperature compensation function. The analog warp signal 158 is subsequently applied to the varactor 118 through the summer circuit 152 to change the varactor reactance by a constant amount over temperature.

Figure 10:
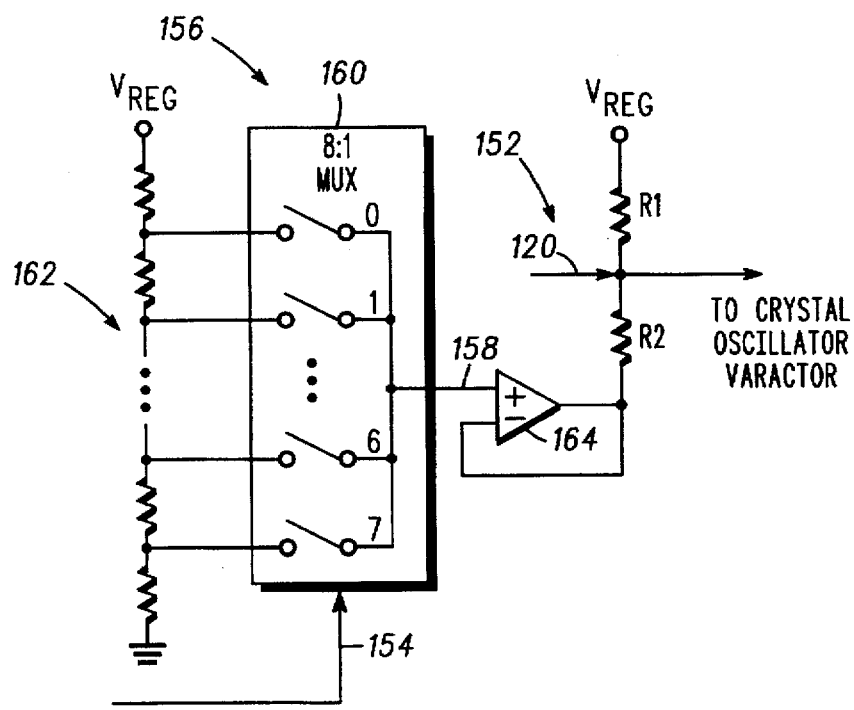
FIG. 10 is a schematic diagram of a preferred embodiment of a warp signal generator and a summer circuit, in accordance with the present invention.

As shown in FIG. 10, the warp signal generator 156 preferably includes a 8:1 multiplexer 160 connected to a resistor string 162 and controlled by the three bit warp signal set 154. The warp signal set 154 directs the multiplexer 160 to select a predetermined tap of the resistor string 162. The output of the multiplexer 160 is coupled to a voltage follower 164 to provide a low impedance to resistors, $R_1$ and $R_2$, of the summer circuit 152 The junction of these resistors receives the summed currents 120 from the differential amplifiers 144,146. The resistors, $R_1$ and $R_2$, provide that a signal at this junction will change in a predictable way in response to the currents 120 from the differential amplifiers 144,146 and the warp signal 158.

Similarly, the two bits 142 controlling the reference voltage 130 of FIG. 7 may include a resistor string and multiplexer (as represented in FIG. 6). However, this function can also be performed by varying the current in a fixed resistor or changing the resistance through which a fixed current flows.

In operation, an uncompensated crystal oscillator frequency response is tested over temperature. This test is done by varying the ambient temperature of the oscillator and recording the output frequency response over temperature. This testing is conducted for several predetermined values of compensation voltage at each test temperature. After the compensation range of temperatures is covered and all the frequencies are recorded, computer modeling (such as commonly available SPICE software used in conjunction with the circuit of FIG. 8) is used to determine the compensation voltage that will result in the best temperature compensation for the oscillator, i.e. that response which best drives the crystal oscillator to have a minimum frequency shift over temperature.

As shown in FIG. 7, an external component 112 which produces a voltage closest to the necessary compensation voltage within the voltage divider or current driver stage 124 is then placed in the circuit 124 in order to provide the predetermined digital data set 128 to complete the compensation. It should be noted that the external component 112 may have been in place previously since the test voltages are forced. Advantageously, this allows either fixed component substitution or component trimming (i.e. resistor laser trimming). If a constant voltage is required, such as when using a resistor, the selected external component 112 must have a suitably low temperature coefficient. Alternatively, a thermistor with a predetermined temperature coefficient of resistance may be used.

Calculated Data

Table 1 shows the calculated data of the predetermined width (µm) of the FETs of the first differential amplifier 144 and the currents (µA) for the first and second current sources 148,150 in order to temperature compensate an AT-cut crystal with the relative Bechmann angle (minutes) shown, in accordance with the present invention.

TABLE 1

Widths and currents required to TC within 5 ppm range.

| Angle | Width | Current 1 | Current 2 |
|-------|-------|-----------|-----------|
| 0.0   | 160   | 4.7       | 23.0      |
| 1.5   | 170   | 4.4       | 18.0      |
| 2.5   | 180   | 3.9       | 13.5      |
| 4.0   | 190   | 3.5       | 9.3       |
| 5.0   | 200   | 3.3       | 6.4       |

Figure 11:
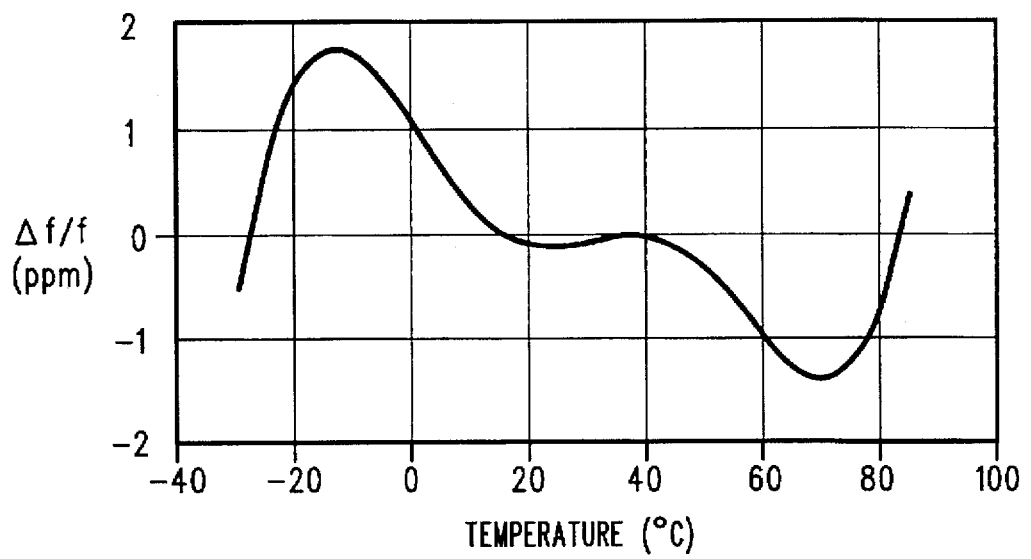
FIG. 11 is a plot of calculated frequency variation versus temperature for a crystal oscillator driven by the temperature compensation circuit of FIG. 8, in accordance with the present invention.

For example, compensating an AT-cut crystal having a relative Bechmann angle of 3 minutes, using the present invention, requires a width of about 184 µm along with a current 1 of about 3.8 µA and a current 2 of about 12.1 µA. Driving a varactor-loaded crystal oscillator using the compensation circuit of FIGS. 7 and 8 and the above values results in a calculated frequency response as shown in FIG. 11. As can be seen, the present invention advantageously provides for a frequency response which retains better than 2 ppm stability over the temperature range of interest (−30° to 85° C.).

Figure 12:
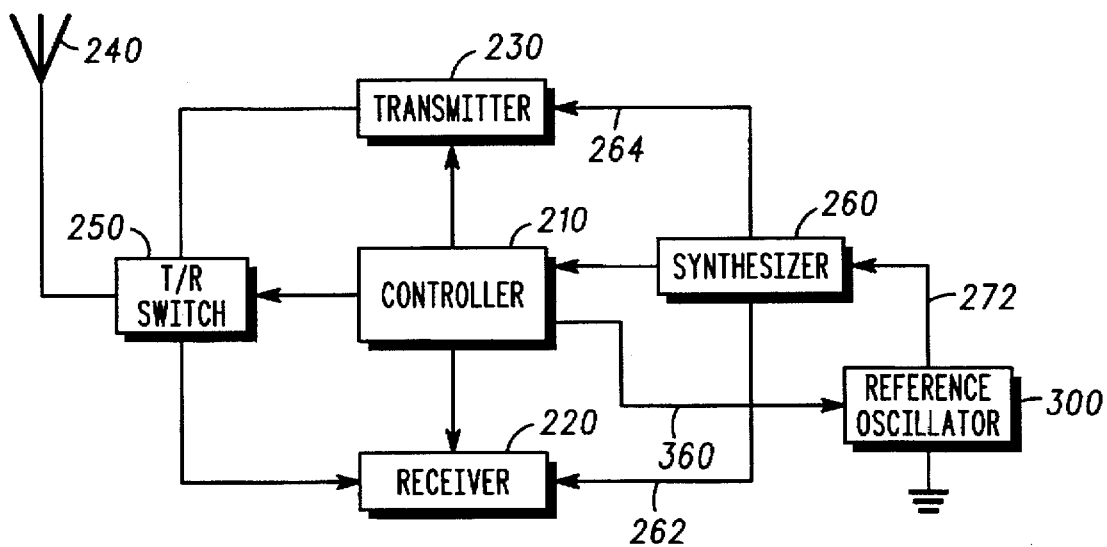
FIG. 12 is a block diagram of a radio which uses the temperature compensation circuit of the present invention.

FIG. 12 shows a block diagram of a communication device 200 which includes the temperature compensated crystal oscillator circuit as a reference oscillator 300, in accordance with the present invention. In one embodiment, the communication device 200 is a transceiver. The communication device 200 comprises a well known frequency synthesized two-way transceiver which operates under the control of a controller 210. The communication device 200 includes a receiver 220 and a transmitter 230 which receive and transmit RF via an antenna 240. The antenna 240 is appropriately switched between the receiver 220 and the transmitter 230 by an antenna switch 250. The communication device 200 also includes a well known phase locked loop synthesizer 260 which under the control of the controller 210 provides a receiver local oscillator signal 262 and a transmitter local oscillator signal 264. A reference oscillator 300 provides a reference oscillator signal 262 for the synthesizer 260. The reference oscillator signal 262 is temperature compensated utilizing the principles of the present invention.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A temperature compensated crystal oscillator circuit, comprising:

a temperature compensation circuit, a crystal oscillator, a voltage variable reactance, an A/D converter, and an external discrete component, the component being coupled in one of a voltage divider and a current driver stage, the voltage variable reactance being coupled to the crystal oscillator and the temperature compensation circuit;

the discrete component being selected to generate a predetermined voltage, the voltage being coupled to the A/D converter which produces a set of digital signals, the digital signals correlating to the predetermined voltage and being coupled to the temperature compensation circuit such that a desired temperature compensation signal is produced; and the compensation signal driving the voltage variable reactance which reactively loads the crystal oscillator such that an output frequency from the crystal oscillator remains substantially constant over a desired range of temperatures.

2. The circuit of claim 1, wherein the external discrete component is selected from one of the group consisting of a resistor having a low temperature coefficient of resistance and a thermistor having a predetermined temperature coefficient of resistance.

3. The circuit of claim 1, wherein the variable voltage reactance is a varactor.

4. The circuit of claim 1, further comprising a summer and a warp signal generator, and wherein the warp signal generator is provided with a set of digital warp signals from the A/D converter and provides an analog warp signal, the analog warp signal and the temperature compensation signal being coupled to the voltage variable reactance through the summer, the digital warp signals being predetermined to drive the voltage variable reactance to reactively load the crystal oscillator to produce a desired nominal output frequency.

5. The circuit of claim 1, further comprising a second discrete component being coupled in one of a second voltage divider and a second current driver stage, a second A/D converter, a warp switching bank, and a plurality of voltage variable reactances, and wherein a predetermined second voltage is generated at the second component, the second voltage being coupled to the second A/D converter, the second A/D converter producing a digital switching signal correlating to the second voltage, the digital switching signal being coupled to the warp switching bank such that the voltage variable reactances are switched into the circuit in response to the second voltage to provide a reactance suitable to load the crystal oscillator to produce a desired nominal output frequency.

6. The circuit of claim 5, wherein the second discrete component is a resistor having a low temperature coefficient of resistance.

7. The circuit of claim 5, wherein the plurality of variable voltage reactances are geometrically-valued varactors.

8. The circuit of claim 1, wherein the temperature compensation circuit includes a temperature compensation voltage generator, a temperature sensor and at least one signal generator controlled by the set of digital signals, the temperature sensor generating an ambient temperature signal which is applied to the voltage generator, the at least one signal generator applying a signal to the voltage generator to produce a predetermined temperature compensation function.

9. The circuit of claim 8, wherein the signal generators include a hot, cold, linear and balance signal generator, and the voltage generator includes a hot, cold and linear programmable differential amplifier, the temperature signal is applied to a first input of each of the differential amplifiers such that a temperature dependent input voltage level is established, a current through a second input of each of the differential amplifier is controlled by an analog signal from each of the respective hot, cold, and linear signal generators such that the inputs provide a temperature dependent differential voltage, a summed output of the differential amplifiers producing a temperature compensation signal from the voltage generator, a balance signal from the balance signal generator being applied to the voltage generator to translate an inflection temperature of the temperature compensation signal.

10. The circuit of claim 8, wherein the at least one signal generator is selected from one of the group of a D/A converter, a set of parallel resistances switchably coupled via a switching bank controlled by the set of digital signals, a string of series resistances switchably coupled via a switching bank, a set of parallel resistances switchably coupled through a voltage follower via a switching bank controlled by the set of digital signals, a string of series resistances switchably coupled through a voltage follower via a switching bank.

11. The circuit of claim 1, wherein the temperature compensation circuit includes a first and second differential amplifier with a corresponding first and second current source and a temperature sensor generating an ambient temperature signal which is applied to the differential amplifiers, the differential amplifiers and current sources responsive to the applied digital signals so as to produce a predetermined temperature compensation function.

12. The circuit of claim 11, wherein the current sources are programmable and the first differential amplifier includes a plurality of transistors of varying channel widths switchably connected in parallel, the temperature signal is applied to a first input of each of the differential amplifiers such that a temperature dependent input voltage level is established, a reference voltage is applied to a second input of each of the differential amplifiers, the respective first and second current sources being programmed to provide a predetermined transconductance in the corresponding first and second differential amplifiers, the transistors being switchably connected to provide an effective channel width such that a predetermined saturation voltage of the transistors is selectable independently of the transconductance of the transistors, a summed output of the differential amplifiers producing a temperature compensation signal.

13. The circuit of claim 12, wherein the warp signal generator and reference voltage are selected from one of the group of a D/A converter, a set of parallel resistances switchably coupled via a switching bank controlled by the set of digital signals, a string of series resistances switchably coupled via a switching bank, a set of parallel resistances switchably coupled through a voltage follower via a switching bank controlled by the set of digital signals, a string of series resistances switchably coupled through a voltage follower via a switching bank, a variable current fixed resistor, and a variable resistance fixed current source.

14. A temperature compensated crystal oscillator circuit, comprising:

a temperature compensation circuit, a crystal oscillator, a varactor, an A/D signal generator, and a resistor having a low temperature coefficient of resistance, the resistor being coupled in a current driver stage, the varactor being coupled to the crystal oscillator and the temperature compensation circuit;

the resistor being selected to generate a predetermined voltage, the voltage being coupled to the A/D signal generator which produces a set of digital signals, the digital signals correlating to the predetermined voltage and being coupled to the temperature compensation circuit such that a desired temperature compensation signal is produced; and the compensation signal driving the varactor which reactively loads the crystal oscillator such that an output frequency from the crystal oscillator remains substantially constant over a desired range of temperatures.

15. The circuit of claim 14, further comprising a summer and a warp signal generator, and wherein the warp signal generator is provided with a set of digital warp signals from the A/D signal generator and provides an analog warp signal, the analog warp signal and the temperature compensation signal being coupled to the voltage variable reactance through the summer, the digital warp signals being predetermined to drive the voltage variable reactance to reactively load the crystal oscillator to produce a desired nominal output frequency.

16. The circuit of claim 14, further comprising a second resistor having a low temperature coefficient of resistance and being coupled in a second current driver stage, a second A/D converter, and a bank of geometrically-valued varactors switchably coupled to the crystal oscillator by a warp switching bank, and wherein a predetermined second voltage is generated at the second resistor, the second voltage being coupled to the second A/D converter, the second A/D converter producing a digital switching signal correlating to the second voltage, the digital switching signal being coupled to the warp switching bank such that the varactors are switched into the circuit in response to the second voltage to provide a reactance suitable to load the crystal oscillator to produce a desired nominal output frequency.

17. The circuit of claim 14, wherein the temperature compensation circuit includes a temperature sensor, a temperature compensation voltage generator including a hot, cold and linear programmable differential amplifier, and a hot, cold, linear and balance signal generator, the temperature signal is applied to a first input of each of the differential amplifiers such that a temperature dependent input voltage level is established, a current through a second input of each of the differential amplifier is controlled by an analog signal from each of the respective hot, cold, and linear signal generators such that the inputs provide a temperature dependent differential voltage, a summed output of the differential amplifiers producing a temperature compensation signal from the voltage generator, a balance signal from the balance signal generator being applied to the voltage generator to translate an inflection temperature of the temperature compensation signal.

18. The circuit of claim 17, wherein the signal generators are selected from one of the group of a D/A converter, a set of parallel resistances switchably coupled via a multiplexer controlled by the set of digital signals, a string of series resistances switchably coupled via a multiplexer controlled by the set of digital signals, a set of parallel resistances switchably coupled through a voltage follower via a multiplexer controlled by the set of digital signals, a string of series resistances switchably coupled through a voltage follower via a multiplexer controlled by the set of digital signals, a variable current fixed resistor, and a variable resistance fixed current source.

19. The circuit of claim 14, wherein the temperature compensation circuit includes a first and second differential amplifier with a corresponding first and second current source and a temperature sensor generating an ambient temperature signal which is applied to the differential amplifiers, the differential amplifiers and current sources responsive to the applied digital signals so as to produce a predetermined temperature compensation signal.

20. The circuit of claim 19, wherein the current sources are programmable and the first differential amplifier includes a plurality of transistors of varying channel widths switchably connected in parallel, the temperature signal is applied to a first input of each of the differential amplifiers such that a temperature dependent input voltage level is established, a reference voltage is applied to a second input of each of the differential amplifiers, the respective first and second current sources being programmed to provide a predetermined transconductance in the corresponding first and second differential amplifiers, the transistors being switchably connected to provide an effective channel width such that a predetermined saturation voltage of the transistors is selectable independently of the transconductance of the transistors, a summed output of the differential amplifiers producing the predetermined temperature compensation signal.

21. The circuit of claim 20, wherein the warp signal generator and the reference voltage are selected from one of the group of a D/A converter, a set of parallel resistances switchably coupled via a switching bank controlled by the set of digital signals, a string of series resistances switchably coupled via a switching bank, a set of parallel resistances switchably coupled through a voltage follower via a switching bank controlled by the set of digital signals, a string of series resistances switchably coupled through a voltage follower via a switching bank, a variable current fixed resistor, and a variable resistance fixed current source.

22. A communication device, comprising:

a receiver circuit;

a local oscillator circuit for generating local oscillator signals including a reference oscillator comprising:

a temperature compensation circuit, a crystal oscillator, a voltage variable reactance, an A/D converter, and an external discrete component, the component being coupled in one of a voltage divider and a current driver stage, the voltage variable reactance being coupled to the crystal oscillator and the temperature compensation circuit;

a predetermined voltage generated at the component, the voltage being coupled to the A/D converter which produces a set of digital signals, the digital signals correlating to the predetermined voltage and being coupled to the temperature compensation circuit such that a desired temperature compensation signal is produced; and the compensation signal driving the voltage variable reactance which reactively loads the crystal oscillator such that an output frequency from the crystal oscillator remains substantially constant over a desired range of temperatures.

\* \* \* \* \*